United States Patent
Levy et al.

(10) Patent No.: US 6,848,069 B1
(45) Date of Patent: Jan. 25, 2005

(54) ITERATIVE DECODING PROCESS

(75) Inventors: Sharon Levy, Tiberias (IL); Daniel Yellin, Ra'anana (IL); Yona Perets, Ra'anana (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/371,275

(22) Filed: Aug. 10, 1999

(51) Int. Cl.$^7$ ...................... H03M 13/00; H03M 13/03

(52) U.S. Cl. ...................... 714/755; 714/758; 714/794; 714/795; 714/796

(58) Field of Search ................................ 714/796, 755, 714/795, 794, 758; 375/262

(56) References Cited

U.S. PATENT DOCUMENTS

| | | | | |
|---|---|---|---|---|
| 4,821,268 A | * | 4/1989 | Berlekamp .................. | 714/784 |
| 5,295,142 A | * | 3/1994 | Hatakeyama ................ | 714/794 |
| 5,761,248 A | * | 6/1998 | Hagenauer et al. ......... | 375/340 |
| 6,094,465 A | * | 7/2000 | Stein et al. .................. | 375/346 |
| 6,161,209 A | * | 12/2000 | Moher ......................... | 714/780 |
| 6,182,261 B1 | * | 1/2001 | Haller et al. ................ | 714/758 |
| 6,192,503 B1 | * | 2/2001 | Chennakeshu et al. ..... | 714/796 |
| 6,233,709 B1 | * | 5/2001 | Zhang et al. ................ | 714/774 |
| 6,256,763 B1 | * | 7/2001 | Oh et al. ..................... | 714/784 |
| 6,298,084 B1 | * | 10/2001 | Vinggaard et al. .......... | 375/224 |
| 6,298,461 B1 | * | 10/2001 | Tong et al. .................. | 714/755 |

FOREIGN PATENT DOCUMENTS

| WO | WO 99/09696 | 2/1999 | |
|---|---|---|---|
| WO | WO 200182486 A1 | * 11/2001 | .......... H03M/13/00 |

OTHER PUBLICATIONS

Cox, R.V. and Sundberg, C.E.W.; An efficient adaptive circular Viterbi algorithm for decoding generalized tailbiting convolutional codes; IEEE Transactions on Vehicular Technology, vol.: 43 Issue: 1, Feb. 1994; Page(s): 57–68.*

De Barros, D.J. and Dorsch, B.G.; An efficient information set algorithm soft–decision decoding of linear block codes; Proceedings IEEE International Symposium on Information Theory. 1997; Page(s): 302.*

Schurgers, C.; Van der Perre, L.; Engels, M. and De Man, H.; Adaptive turbo decoding for indoor wireless communication; International Symposium on Signals, Systems, and Electronics, 1998; Page(s): 107–111.*

Shibutani, A.; Suda, H. and Adachi, F.; Reducing average number of turbo decoding iterations; Electronics Letters , vol.: 35 Issue: 9, Apr. 29, 1999 Page(s): 701–702.*

Koumoto, T.; Takata, T.; Kasami, T. and Shu Lin; A low–weight trellis–based iterative soft–decision decoding algorithm for binary linear block codes; IEEE Transactions on Information Theory, vol.: 45 Issue: 2, Mar. 1999 Page(s): 731–741.*

H.–A. Loeliger; A practical reliability metric for block codes used on binary–input channels; IEEE Transactions on Communications; vol.: 38 Issue: 4 , Apr. 1990 Page(s): 405–408.*

Stephen B. Wicker, Error Control Systems for Digital Communication and Storage, Prentice–Hall, 1995.*

A. Shibutani et al., "Reducing Average Number of Turbo Decoding Iterations", Electronics Letters, Apr. 29, 1999, vol. 35, No. 9 pp. 701–702.*

(List continued on next page.)

*Primary Examiner*—Albert Decady
*Assistant Examiner*—Joseph D. Torres
(74) *Attorney, Agent, or Firm*—Eitan, Pearl, Latzer & Cohen Zedek, LLP (57) ABSTRACT

Briefly, a method to decode a block of information of a turbo code to produce a decoded block. The method may determine from a structure of an error detection code one or more possible error patterns and may generate a reliability metric based on one or more of the one or more possible error patterns and the decoded block.

14 Claims, 7 Drawing Sheets

OTHER PUBLICATIONS

C. Berrou et al., "Near Shannon Limit Error–Correcting Coding and Decoding: Turbo–Codes", Proc. ICC, May 1993, pp. 1064–1070.

Hagenauer et al., "Iterative Decoding of Binary Block and Convolutional Codes", IEEE Transactions on the Information Theory, vol. 42, No. 2, 1996, pp. 429–445.

Yellin et al. "Joint Equalization and Coding for Intersymbol Interference Channels", IEEE Transactions on the Information Theory, vol. 43, No. 2, 1997, pp. 409–425.

Lin et al., "Hard–Decision–Aided Turbo Decoding", International Symposium on Turbo Codes, 1997, pp. 235–238.

Hagenauer, Joachim, "The Turbo Principles: Tutorial Introduction and State of the Art", International Symposium on Turbo Codes, 1997, pp. 1–11.

Johannesson et al., *Fundamental's of Convolutional Coding*, The Institute of Electrical and Electronics Engineers, Inc., New York, 1999, pp. 1–3.

Proakis, John, *Digital Communications*, Third Edition, McGraw–Hill Series in Electrical and Computer Engineering, McGraw–Hill, Inc., 1995, pp. 1–3.

Heegard et al., *Turbo Coding*, Kluwer Academic Publishers Group, 1999, pp. 1–9.

Benedeto et al., "Serial concatenation of interleaved codes: performance, analysis, design and iterative decoding", TDA progress report 42–126, Aug. 15, 1996.

G.C. Clark and J.B. Cain, "Error correction coding for digital communication", Plenum Press, 1981, p. 102–107.

S. Lin and D.J. Costello, "Error control coding: fundamentals and applications", Prentice–Hall 1983, p. 259–261.

* cited by examiner

ITERATIVE DECODING PROCESS

BACKGROUND OF THE INVENTION

The present invention relates to an iterative decoding process, and particularly to a method for reducing the average number of iterations in an iterative decoding process.

Digital communication systems include a channel encoder which introduces redundancy in the transmitted information to be used at the receiver for increasing the reliability of the received information. In many cases, the information encoded by the channel encoder includes a sequence of source bits and code bits based on a predetermined error detection structure. The output of the channel encoder is transmitted to the receiver. After the decoding of the information bits (by the channel decoder), the receiver decodes the received digital information in accordance with the predetermined error detection structure, and utilizes the decoded code bits to detect errors in the transmitted source bits, so that the transmitted information can be corrected, retransmitted, or tagged as unreliable.

Various encoding techniques are known for channel encoding, including multi-dimensional codes, e.g., parallel concatenated codes (PCC), serial concatenated codes (SCC), and hybrid concatenated codes (HCC). Of particular importance at the present time are the parallel, chained, systematic recursive code called "turbo-codes", disclosed by C. Berrou, et. al., in the publication "Near Shannon Limit Error-Correcting Coding and Decoding: Turbo-Codes", Proc. ICC, May 1993, pp. 1298–1303, hereby incorporated by reference. Such multi-dimensional codes are iteratively decoded, e.g., by utilizing a predetermined fixed number of iterations. Preferably, however, an adaptive abort criterion is utilized to minimize the number of iterations. For example, Hagenauer et. al., U.S. Pat. No. 5,761,248, of Jun. 2, 1998, includes a general discussion of turbo-codes and a description of a prior art abort criterion based on "noise variance" identified after an iteration step, and discloses an abort criterion based on relative enthropy, namely the measure of the loss of information in a transmitted message after an iteraration step for reducing the average number of iterations.

OBJECT AND BRIEF SUMMARY OF THE PRESENT INVENTION

An object of the present invention is to provide another method of iteratively decoding information in order to reduce the average number of iterations.

According to a broad aspect of the present invention, there is provided a method of iteratively decoding a block of information based on a predetermined error detection structure, comprising:

performing a sequence of iterations for decoding the block of information to produce a decoded output in each iteration;

producing from the decoded output, and the predetermined error detection structure, a reliability metric for the respective iteration, which reliability metric is based on said predetermined error detection structure; and utilizing the reliability metric as a criterion in an abort decision with respect to further iterations of decoding the respective block of information.

In the described preferred embodiment, the reliability metric is determined from a list of possible error patterns in the decoded output produced from the decoded output and the predetermined error detection structure.

According to further features in the preferred embodiment of the invention described below, the possible error pattern having the highest probability of occurring of those in the produced list is used in determining the reliability metric for the respective iteration. The possible error pattern having the second highest probability of occurring of those in the produced list may also be used in determining the reliability metric for the respective iteration.

According to further features in the described preferred embodiment, a reliability metric is determined for each bit in the decoded output for each iteration, and the list of possible error patterns produced in one iteration is also used for changing the decoded output bits and the reliability metric used for the next iteration. When the latter optional feature is used, the method thus refines the reliability metric calculated during the current iteration for decreasing even further the average number of iterations.

It was found that the use of these techniques could significantly decrease the average number of iterations (and therefore the power consumption), and in some cases could even improve the performance of the decoder.

Further features and advantages of the invention will be apparent from the description below.

BRIEF DESCRIPTION OF THE DRAWINGS

The invention is herein described, by way of example only, with reference to the accompanying drawings, wherein:

FIGS. 1–7 are diagrams relating to existing (prior art) systems helpful in understanding the present invention, in which:

DETAILED DESCRIPTION OF THE PRIOR ART—(FIGS. 1–7)

Figure 1:
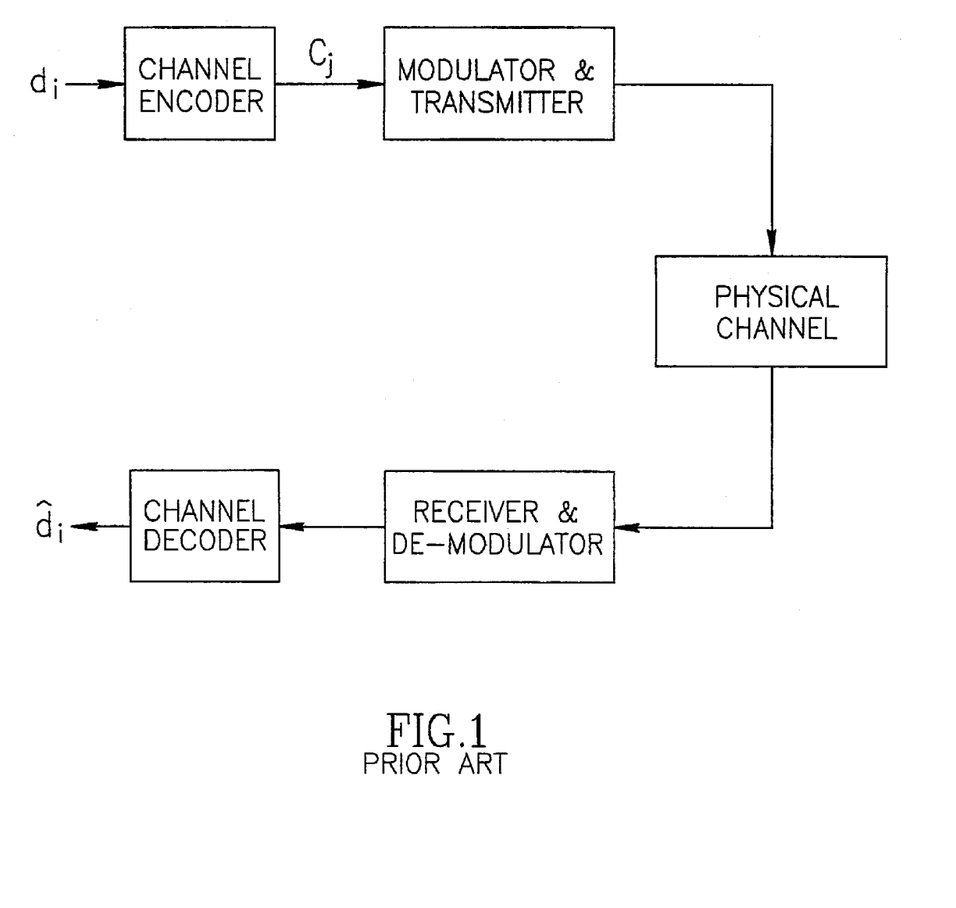
FIG. 1 is a block diagram of a conventional communication system.

FIG. 1 illustrates a general communication system in which the source bits ($d_i$) are usually assumed to be equally, independent and identically distributed (i.i.d.). This assumption is justified from the common use of a source encoder (not shown) which removes some redundancy from (compresses) the source data.

The channel encoder adds redundancy to the source information and creates a code symbols ($c_j$). The code symbols are modulated and transmitted through a physical channel.

The receiver and the demodulator gather information from the channel and pass it to the channel decoder. The channel decoder output is an estimation of the source bits ($d_i$). In some cases the decoder also estimate the reliability of each source bit ($d_i$) and/or code bit (ci).

It is important to emphasis that all practical communication systems have a positive decoding error probability (which may be extremely low). A decoding error is defined as occurring when the transmitted data ($d_i$) is different from the decoded data ($\hat{d}_i$).

While some forms of transmitted information (such as voice) are insensitive to a few decoded errors, others (such as compressed files) are extremely sensitive.

Figure 2:
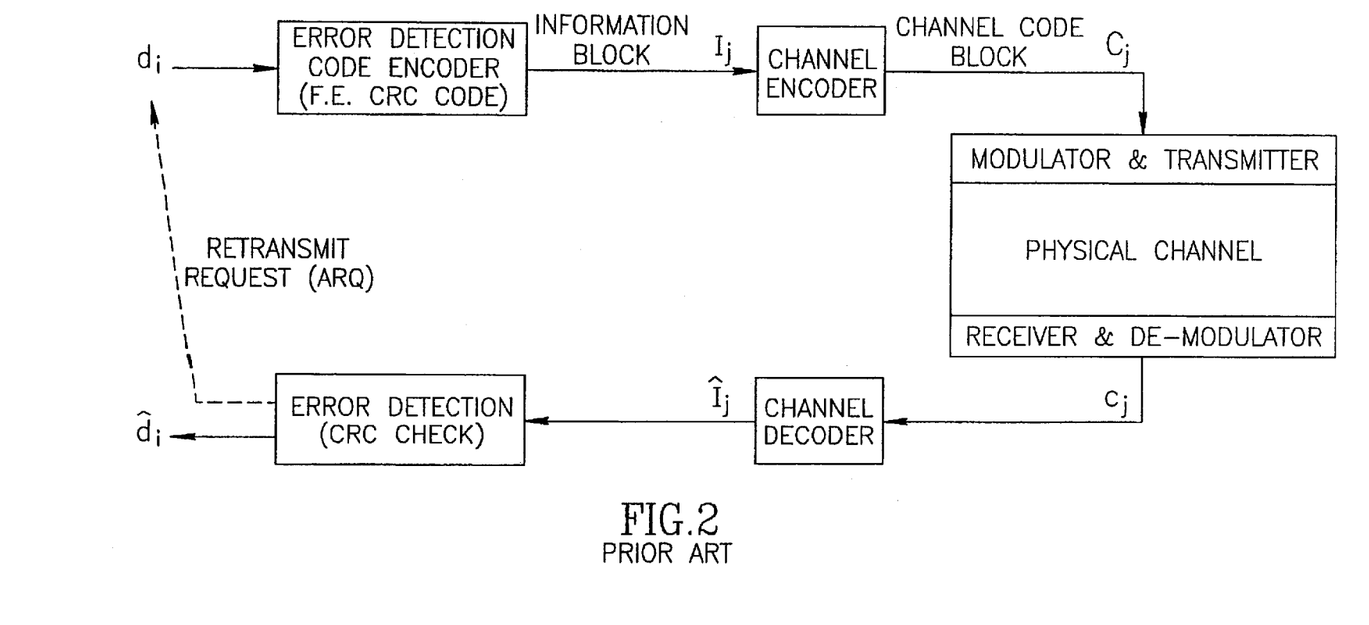
FIG. 2 is a block diagram of a communication system with an ARQ (automatic repeat request) protocol.

FIG. 2 illustrates one approach to deal with decoding error, namely to use an Automatic Repeat Request (ARQ) mechanism. An ARQ mechanism is based on dividing the source data into small data blocks and encoding each block with an error detection code (e.g. CRC—cyclic redundancy code) prior to the channel coding. The error correction (channel) encoder encodes the output of the error detection code. The input bits of the channel encoder are called the information bits, and each group of information bits, generally called an information block, is processed together by the channel encoder.

At the receiver side, after decoding the information block (by the channel decoder) the error detection decoder identifies the (or most of the) decoding errors. In the case that a decoding error is detected, a retransmission request is sent through a feedback channel.

CRC (Cyclic Redundancy Code) is one of the most commonly used error detection codes. The input to the CRC encoder (the source bits) affect the state of a shift register. The CRC encoder output bits consists the source bits and bits which represent the state of the shift register.

Figure 3:
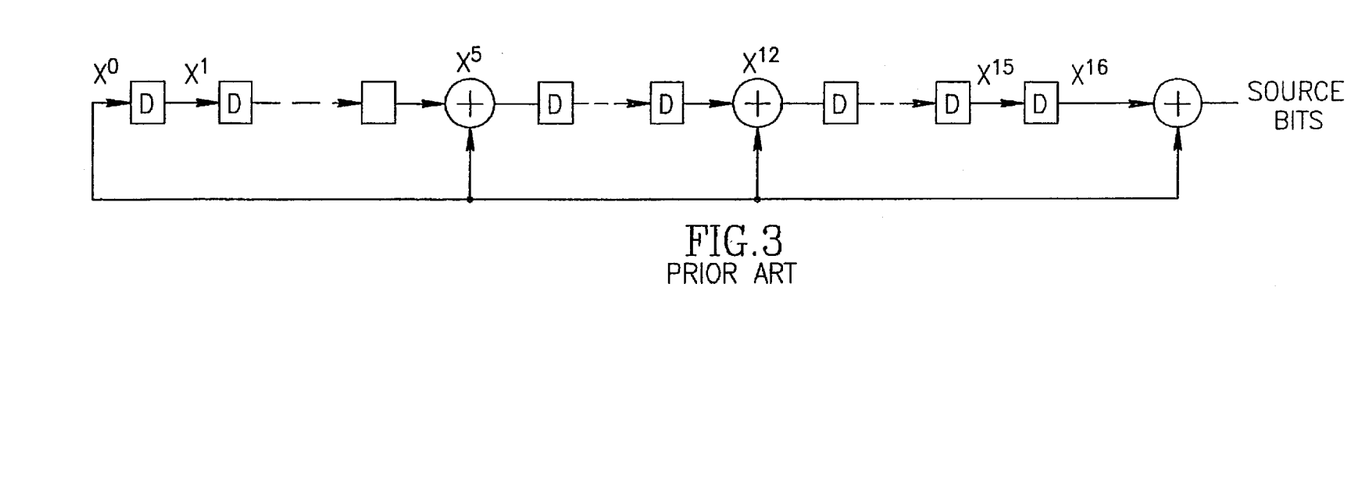
FIG. 3 is a diagram of a classical 16 bit CRC (cyclical redundancy code)

FIG. 3 illustrates one example of a CRC encoder. The D symbol represents a memory element (D stands for Delay), and the + symbol represents binary addition (0+0=1+1=0; 1+0=0+1=1). The output of the CRC encoder (inform consists of the source bits and the last value of the memory elements which represents the state of the shift register. It is common practice to call those extra bits (the shift register memory value) the CRC bits, or the CRC vector.

Throughout this description, the term "information bits reliability metric" is used to define both the decoded value and the confidence value of the decoded information bits. A commonly used reliability metric ($L_i$) is defined in terms of the channel data (e.g. the input into the channel decoder in FIG. 2) as follows:

$$L_i \equiv \log\left(\frac{\hat{P}(I_i = 1 \mid \text{channel data})}{\hat{P}(I_i = 0 \mid \text{channel data})}\right)$$

where:

$\hat{P}(I_i=1|\text{channel data})$ represents the estimated probability that the i'th information bit is equal to one based on the data received from the channel. The absolute value of Li defines the confidence level, and the sign defines the decoded value.

A group of channel codes having excellent performance with a practical decoder are the concatenated codes. The encoder for concatenated codes is built from several simple encoders connected to each other by an interleaver. An interleaver is an element, which permutes its inputs.

Figure 4:
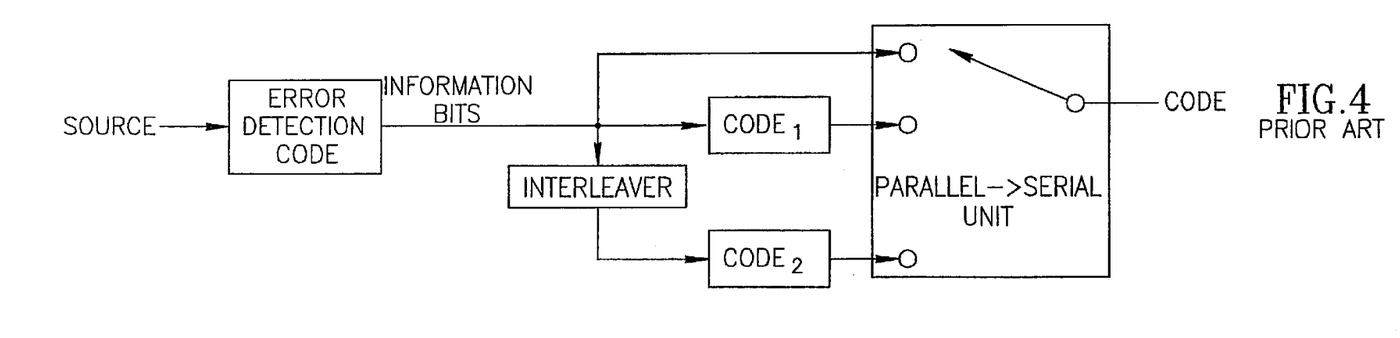
FIG. 4 is a block diagram of an encoder for parallel code concatenation (PCC), e.g., a turbo encoder.

In parallel code concatenation (for example as described in the C. Berrou et al. publication cited above and incorporated herein by reference), the input bits (information) are shared between two (or more) sub-codes. The code bits consist of the source bits (called systematic data), and some of the parity bits of the sub-codes. FIG. 4 illustrates a Turbo encoder for parallel code concatenation (PCC).

Figure 5:
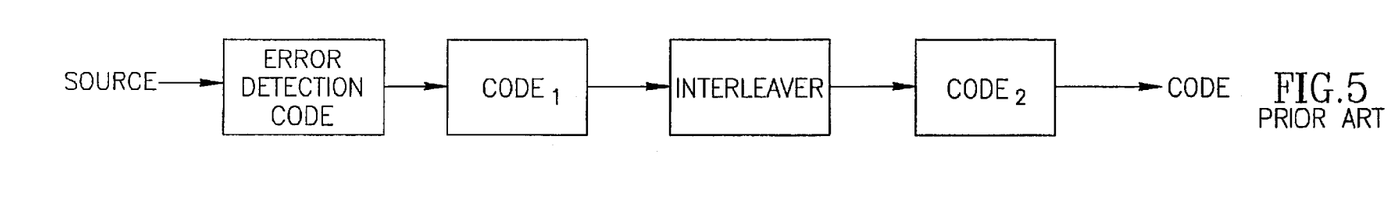
FIG. 5 is a block diagram of an encoder for serial code concatenation (SCC)

Serial code concatenation (described in Benedeto et al. "Serial Concatenation of Interleaved Codes: Performance, Analysis, Design and Iterative Decoding", TDA progress report 42–126, Aug. 15, 1996, incorporated herein by reference), has a comparable performance with parallel code concatenation and a similar decoder. FIG. 5 illustrates an encoder for serial code concatenation (SCC).

Figure 6:
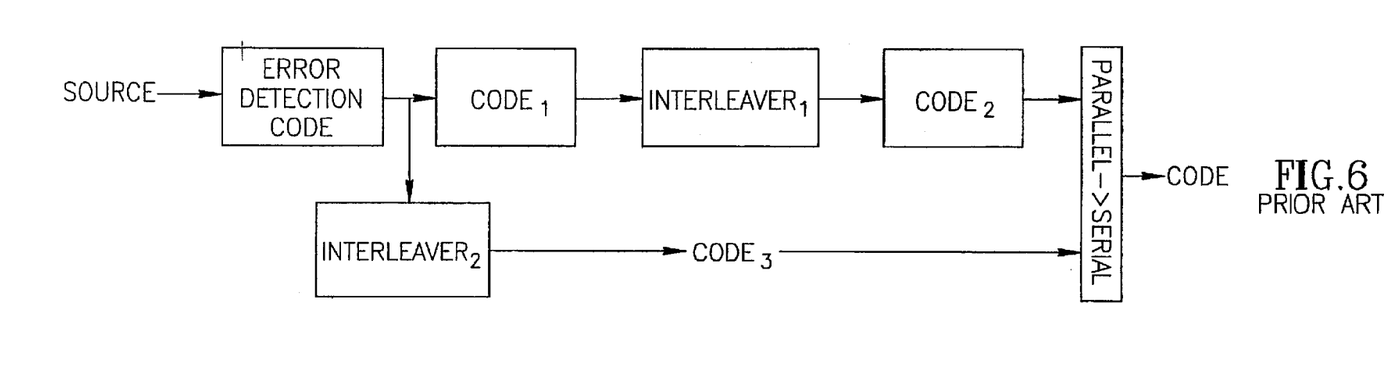
FIG. 6 is an encoder for hybrid code concatenation (HCC)

A generalization of the serial and parallel concatenation is the hybrid code which can be described as a tree of sub-codes. FIG. 6 illustrates an encoder for hybrid code concatenation (HCC).

The best known (sub-optimal) practical decoder for concatenated codes is the iterative decoder, which decodes each of the sub-codes at a time with information exchange between the sub-codes.

Figure 7:
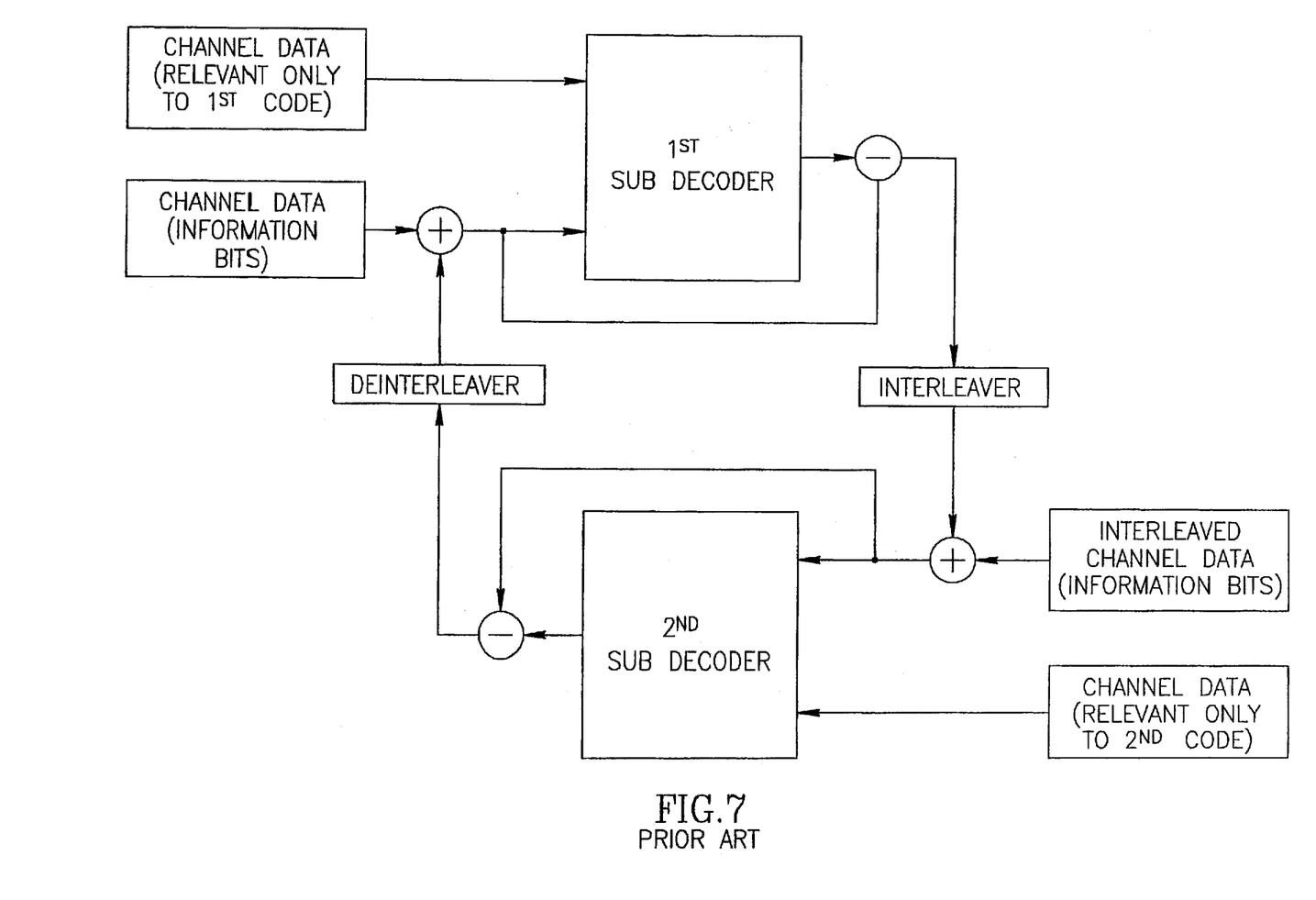
FIG. 7 is a block diagram of a turbo decoder.

FIG. 7 depicts an iterative decoder of a Turbo code with two sub-codes. The first decoder uses the relevant channel information to estimate the value and the reliability metrics for each symbol in its input. The extrinsic information (the change in reliability metric for each information bit) refines the channel information used by the second decoder. The second decoder uses the refined information to create its own reliability metric estimation and extrinsic information. The second extrinsic information refines the channel information used by the first decoder.

After repeating the process for several times, the decoder estimates the value of the information bits according to their reliability metric, usually according to the sign, e.g., $\hat{i}$=sign (Li). This estimation is referred to as a hard decision.

A decoding iteration is the process of decoding all the sub-codes and calculating reliability and extrinsic information for decoding any single sub-code.

For a serial concatenated code (SCC), the iterative decoding is similar, with an exchange of different reliability metrics (each metric belongs to intermediate bits that exist inside the encoder). A complete and relatively intuitive description of the iterative decoding process appears in Hagenauer et al. "Iterative Decoding of Binary Block and Convolutional Codes", IEEE Tran. Inform. Theory Vol. 42 No 2, pp. 429–445, March 1996, incorporated herein by reference.

The error probability in an iterative decoding process is dependent on the number of iterations. In most cases, an increase in the number of iterations improves the performance. The first approach was to set the number of iterations to a fixed number according to the required performance and other implementation considerations. It has been observed, however, that the lasts iterations fixes only a small portion of the code words, and for most code blocks a much lower number of iterations is sufficient.

From this observation a number of abort criteria for the iterative decoding process have been suggested, including: Comparing the hard decisions resulting from the decoding of the two sub-codes; if the hard decision values agree, the decoding process is terminated. Using the estimated variance and mean or cross entropy between iterations, as described in the above-cited Haganauer U.S. Pat. No. 5,761, 248, Jun. 2, 1998, incorporated herein by reference.

These options implicitly assume that the decoding iterations converge to a fixed point. This assumption is correct for many cases, but there are some cases where the convergence is to an incorrect result, or where the decoder fails to converge.

Another approach for decreasing the average number of iterations is to select a reliable set of source bits (using their reliability metric as a criterion), and to set their reliability magnitude to the highest possible value, for example, to infinity. The selected bits serve as anchors and decrease the number of iterations. The main drawback of this method is that it produces a minor increase in the error probability.

DETAILED DESCRIPTION OF THE PRESENT INVENTION

Briefly, the present invention decreases the average number of iterations by utilizing a reliability metric produced during an iteration step as a criterion in an abort decision with respect to further iterations. Optionally, the reliability metric produced during one iteration may be used for correcting some of the decoding errors.

The method is described below particularly for decoding of parallel code concatenation (PCC), but is also applicable for decoding of serial code concatenation (SCC) by introducing minor modifications as will be described below.

Figure 8:
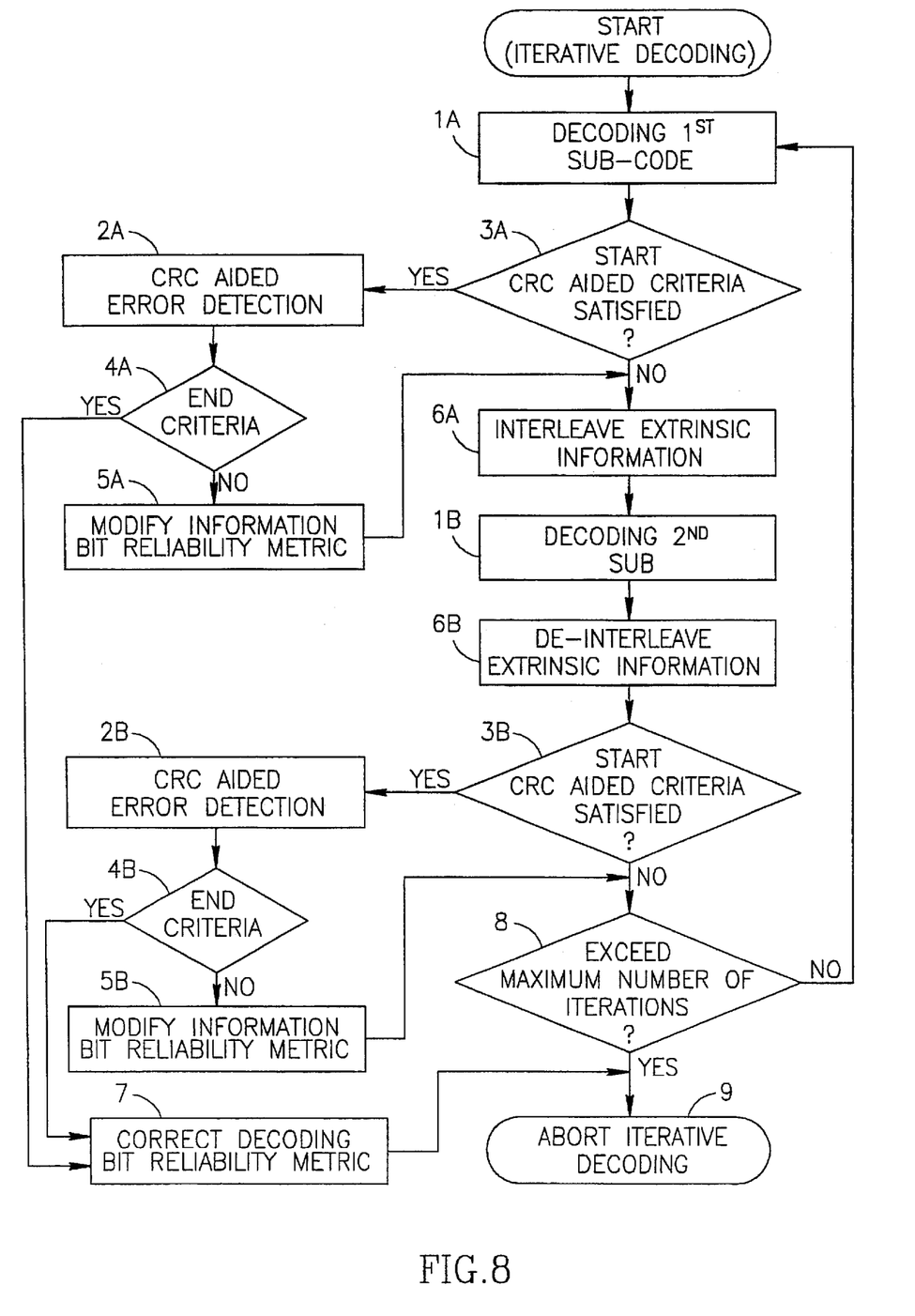
FIG. 8 is flow chart illustrating a decoding process in accordance with the present invention.

Reference is now made to FIG. 8 which illustrates a flow diagram of a decoding process in accordance with the present invention.

The first stage is to decode the $1^{st}$ sub-code (block $1a$) followed by a CRC-aided error detection process (block $2a$). A possible recommended optimization (block $3a$) is to activate this stage only if a predetermined criterion is satisfied; for example the criterion could be a minimum number of iterations per SNR (signal to noise ratio) value, a comparison of the number of information bits having a low reliability metric to a threshold, etc.

The CRC-aided error detection process (block $2a$, described below in detail) identifies a possible error pattern and creates a reliability metric for the correction. Where the correction seems reliable enough (block $4a$), the decoding error is corrected, and the iterative decoding is terminated (aborted).

Where the correction is not reliable enough, the information bits reliability metric (which was created by the $1^{st}$ decoder) may be refined by modifying it according to the detected error pattern and the corresponding reliabilities (block $5a$). This modification of the information bits reliability metric, which is generally a function of the error pattern and its metric, may be viewed as an extension to the Lin et al. publication "Hard Decision Aided Iterative Decoding" The Inter Symposium on Turbo Codes and Related Topics, of Sep. 3–5, 1997, incorporated herein by reference. After extrinsic information exchange through the interleaver (block $6a$), the decoding of the $2^{nd}$ sub-code takes place (block $1b$) as in a regular iterative decoding process. After de-interleaving (block $7b$), the same process is repeated for the $2^{nd}$ sub-code (blocks $2b$–$5b$), with possible minor modifications especially in blocks $3b$ and $4b$.

When the abort criterion has been satisfied (block 7), or when a predetermined maximum number of iterations has been reached (block 8), the iterative decoding process is terminated, and the estimation of the information bits is outputted (block 9).

Figure 9:
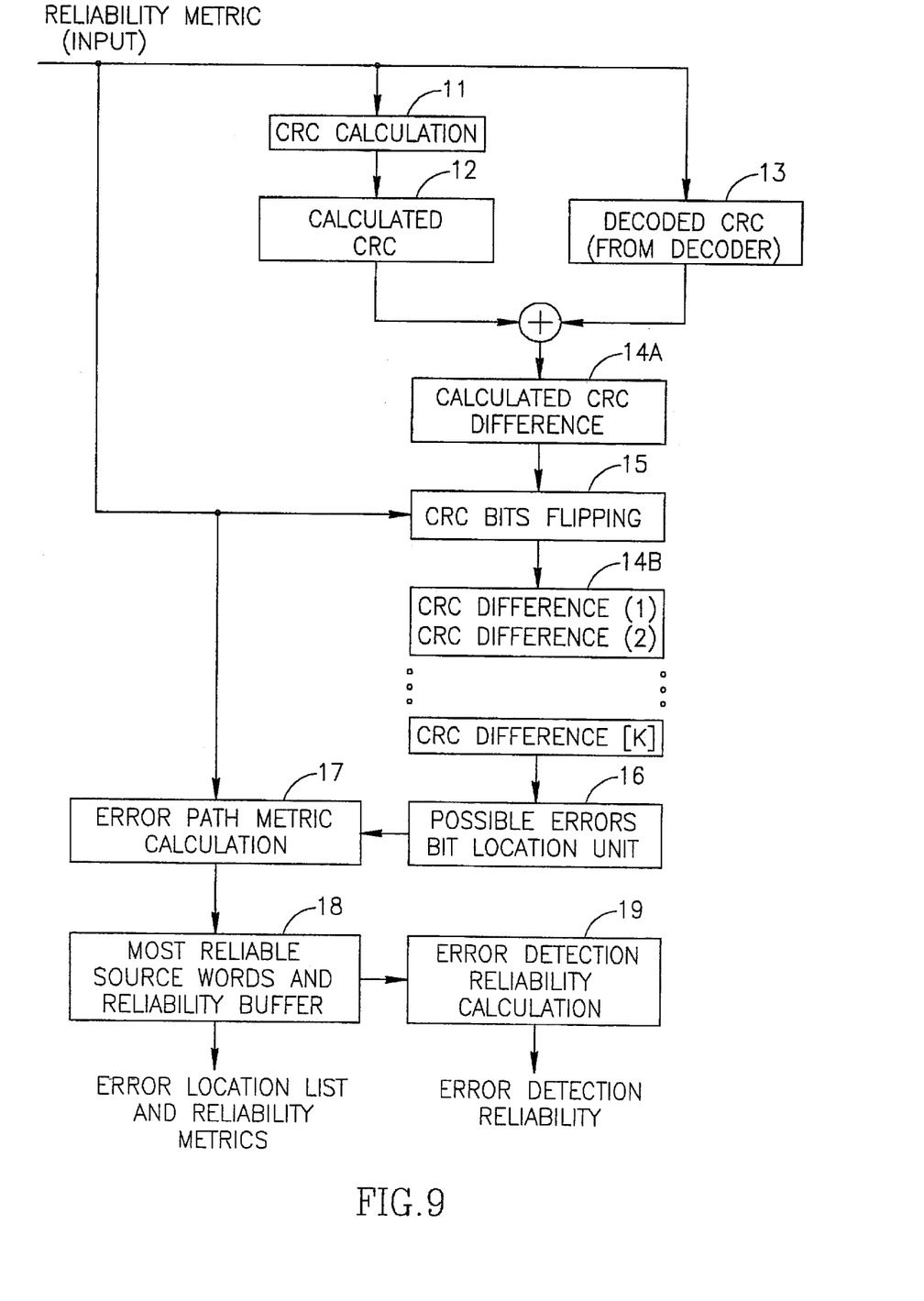
FIG. 9 is a flow chart illustrating the CRC aided error detection process in the flow chart of FIG. 8.

FIG. 9 is a flow diagram illustrating one manner of performing the CRC aided error detection process of blocks $2a$, $2b$, FIG. 8, for a single information block.

The first stage is to create a list of possible error patterns, as shown by block 11–16 in FIG. 9; the second stage is to calculate the reliability metric for each error pattern (blocks 17, 18) and for the detected error pattern (block 19).

Because of the linearity of the CRC error detection structure, the error pattern is independent of the actual CRC bits in the information block. The novel method uses the difference between the CRC bits calculated from the decoded source bits (blocks 11 and 12), and the decoded CRC bits received from the decoder and stored (block 13). The difference is calculated and stored (block $14a$).

The decoded CRC bits (block 13) may contain errors. To reduce the effect of those errors, a CRC bits flipping process is performed (block 15) to create a list of possible CRC difference vectors (based on the CRC structure and decoded CRC bits reliability metric), and to store them (block $14b$).

Each CRC difference vector stored according to block $14b$ is related to a possible error pattern in the decoded CRC. If this vector is assumed to equal to the difference between the real (transmitted) CRC vector and the calculated CRC vector (per block 12), it would contain all the information that can be gained from the CRC about the error in the source bits. The CRC difference list is therefore defined as a syndrome list.

For each possible "syndrome" produced in block $14b$, a "possible error bit location unit" (block 16, described in detail below) creates a list of error patterns in the source bits. The combination of the errors in the CRC bits, and in the source bits, defines the error pattern in the whole information block.

For each error pattern, a reliability metric is calculated (block 17) and stored (block 18). Based on the error patterns and their reliability metrics, the most reliable error is selected, and the error pattern reliability (e.g. the probability estimation) is calculated (block 19).

There are many possible implementations for the possible error bits location unit of block 16, FIG. 9. One implementation is to check all the possible error combination in the $N_1$ source bits, which have lowest reliability metric. Another option is to compare the extrinsic information and the reliability metric. The option which appears to be preferable in the 16-bit CRC example of FIG. 3 is illustrated in the flow charts of FIGS. 10 and 11.

Figure 10:
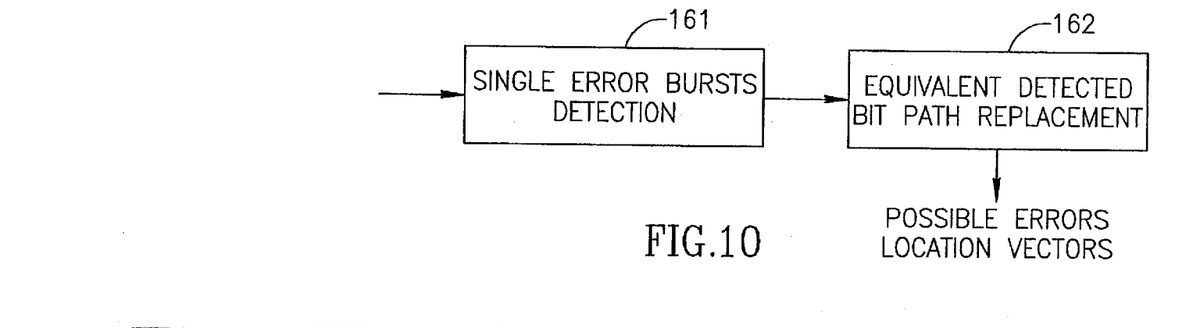
FIG. 10 is a block diagram illustrating a possible error bit location unit included in the flow chart of FIG. 9.

Thus, as shown by block 161 in FIG. 10, a search is made to detect single error bursts in the error patterns. An error pattern is considered an error burst when the first and last decoded bits which have an error are close to each other. The search for burst error is made because many codes have errors which appear in bursts (due to the decoding of the $1^{st}$ sub-code). Another reason is that simple methods are known for detecting burst errors for the CRC code.

Each bit in the burst error pattern is replaced by several multiple bits which include errors having the same effect on the CRC (box 162). As an example, for a single error at location X, the following path has an equivalent effect of the CRC:

Single error at location X.
Multiple errors at location X+5, X+12, X+16.
Multiple errors at location X−5, X+7, X+11.
Multiple errors at location X−12, X−7, X+4.
Multiple errors at location X−16, X−11, X−4.

The above search for nearby error patterns (box 162) may be viewed as looking for neighbor error patterns, while the distance metric is the Hamming distance; see for example, G. C. Clark and J. B. Cain, "Error Correction Coding for Digital Communication", Plenum Press, 1981.

Figure 11:
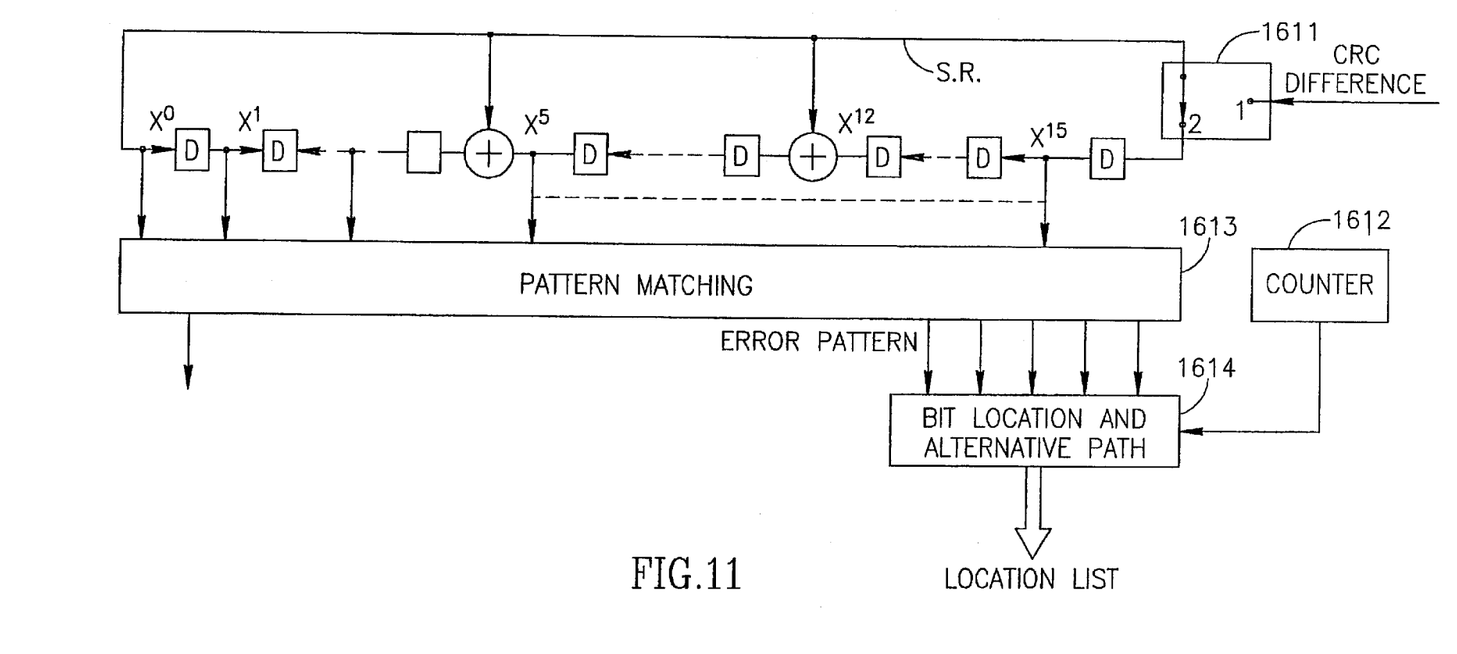
FIG. 11 is a block diagram of a single burst error detection unit included in FIG. 10.

FIG. 11 illustrates a single burst error detection unit which may be used for performing the operation of box 162 in FIG. 10. This is a classical method for detecting burst errors in a 16-bit CRC code.

For the first 16 clocks, the switch 1611 to the shift register SR is in the "1" position. During this stage, the value of the CRC bits are loaded into the memory elements of the shift register SR. After the loading is completed, switch 1611 is turned to position "2". For each clock, the counter 1612 and the status of the shift register are updated.

The process terminates if the shift register state is equal to one of the predetermined patterns in the pattern matching unit 1613, or if the counter exceeds the source block size. With the knowledge of the matched pattern and the counter value, the error bit location unit 1614 determines the location of the bits in the error pattern. A more complete description of this method may be found in many textbooks (e.g. S. Lin and D. J. Costello: "Error control coding: fundamentals and applications", Prentice-Hall 1983, hereby incorporated by reference).

The error path metric calculation performed in block 17 of FIG. 9 calculates for each error pattern a reliability metric ($M_w$). A possible reliability metric is the summation of all the bits metric which have a decoding error.

$$\left( M_w = \sum_{\substack{i, \\ d_i \neq sign(L_i)}} -|L_i| \right).$$

The results of this calculation are fed to a buffer (block 18, FIG. 9) which outputs a list of error locations and reliability metrics. Block 18 also produces an output which is used to calculate the error detection reliability (block 19, FIG. 9).

The calculation of the error detection reliability in block 19 produces a binary output and is based on the two most reliable candidate paths. If the reliability of the first candidate path exceeds a threshold, and the reliability difference between the two candidates exceeds another threshold, the error detected is considered reliable; otherwise the error detection is considered reliable. It is important to emphasis that too low thresholds will increase the BER (bit error rate) and the FER (frame error rate).

In some cases, each information block is a concatenation of several sub-blocks. For each one of the sub-blocks a CRC is attached.

The "CRC-Aided decoding" process is also suitable for the case that the error correction code encoder input (information block) is built from several sub-blocks. The needed modification is to treat each sub-block separately, and to combine the reliability metric of all the sub-blocks in the end criteria check (blocks 4a and 4b in FIG. 8).

The process set forth in blocks 5a, 5b in FIG. 8, to modify the information bit reliability metric, is an optional process which may be used to refine the reliability (and therefor the extrinsic information) for each decoded bit.

One possibility is to change only the reliability metric that belongs to the information bits in the detected error pattern. To illustrate this option, let it be assumed that the relevant decoded bit reliability is +5 (which means it is decoded to 1). The reliability can be decreased to +3, or even to −1 (which means that the decoded value is changed to 0). For the case that the information block is built from several sub-blocks, the magnitude of the reliability metric of sufficiently reliable sub-blocks may be increased in order to speed up the decoding of the other sub-blocks. The increase could be implemented by multiplying the reliability metric by an adaptive constant (>1.0).

The method described above may be modified in the following manner in order to fit it for iterative decoding of serial concatenated codes (SCC).

The CRC aided decoding is relevant only during the decoding of the outer-most code (the code with the information block in its encoder input).

Only error patterns which fit to the outer code structure are relevant.

The modification in the information bits reliability metric is for the outer encoder code bits and not for the information bits.

While the invention has been described with respect to preferred embodiments, it will be appreciated that these are set forth merely for purposes of example, and that variations and applications can be made. For example, the abort decision can include other abort criteria in addition to the reliability metric based on a predetermined error detection structure as described above. Also, the invention could be used with other code structures, such as low density parity code (LDPC). Many other variations, modifications and applications of the invention will also be apparent to those skilled in this field.

What is claimed is:

1. A method comprising:
   decoding a block of turbo encoded data bits, the data bits comprising information bits and error detection code bits, to produce a decoded block which includes decoded information bits and decoded error detection code bits;
   determining from the decoded error detection code bits and calculated error detection code bits one or more possible error patterns of the error detection code bits; and
   generating from the error detection code bits one or more possible reliability metrics for said one or more possible error patterns.

2. The method according to claim 1, comprising:
   generating a list of possible error patterns of the decoded block by combining, said one or more possible error patterns of the error detection code bits with an error pattern of the decoded information bits; and
   generating a decoded block reliability metric based on one possible error pattern selected from the list of possible error patterns.

3. The method according to claim 2, wherein generating the decoded block reliability metric comprises:
   generating the decoded block reliability metric based on a possible error pattern having the highest probability of occurring in the list of possible error patterns.

4. The method according to claim 2, wherein generating the decoded block reliability metric comprises:
   generating the decoded block reliability metric based on a possible error pattern having the second highest probability of occurring in the list of possible error patterns.

5. The method according to claim 2, further comprising:
   modifying the decoded block based on the decoded block reliability metric.

6. The method according to claim 2, wherein generating said decoded block reliability metric comprises:
   calculating one or more reliability bits of one or more bits of the decoded information bits; and
   calculating one or more reliability bits of the decoded error detection code bits.

7. The method according to claim 2, comprising:
   repeating decoding, determining and generating until the decoded block reliability metric reaches a predetermined threshold of reliability.

8. The method according to claim 1, comprising:
   repeating decoding, determining and generating a predetermined number of times.

9. A method comprising:

decoding a block of turbo encoded data bits, the data bits comprising information bits and Cyclic Redundancy Code bits, to produce a decoded output which includes decoded information bits and decoded Cyclic Redundancy Code bits;

producing a list of possible Cyclic Redundancy Code error patterns from the decoded Cyclic Redundancy Code bits and calculated Cyclic Redundancy Code bits; and determining from said list of possible Cyclic Redundancy Code error patterns a reliability metric of the Cyclic Redundancy Code bits.

10. The method according to claim 9, further comprising:

producing a list of possible error patterns, wherein an error pattern of the list of possible error patterns is a combination of a possible Cyclic Redundancy Code error pattern with an error pattern of the decoded information bits;

in a first decoding iteration, using the list of possible error patterns to modify bits of the decoded output; and in a second decoding iteration, using a reliability metric of the decoded output to modify bits of the decoded output.

11. The method according to claim 10, comprising:

calculating the reliability metric of all the bits in the decoded output having decoded error bits.

12. The method according to claim 9, further comprising:

comparing a first reliability metric of the decoded output produced in a first decoding iteration to a second reliability metric of the decoded output produced in a second decoding iteration preceding the first decoding iteration; and producing an abort decision when the difference between the first and second reliability metrics is below a predetermined threshold.

13. The method according to claim 9, further comprising:

iteratively decoding said block of information bits; and automatically aborting the iterative decoding upon reaching a predetermined maximum number of iterations.

14. The method according to claim 9, further comprising:

generating at least possible one error pattern in said list of possible error patterns by subtracting at least one decoded Cyclic Redundancy Code bit from at least one calculated Cyclic Redundancy Code.

* * * * *